US012702047B2

(12) United States Patent
Sobue et al.

(10) Patent No.: US 12,702,047 B2
(45) Date of Patent: Aug. 4, 2026

(54) CURABLE RESIN FILM, FILM MATERIAL FOR SEMICONDUCTOR DEVICE PRODUCTION, CURABLE RESIN COMPOSITION FOR SEMICONDUCTOR DEVICE PRODUCTION, AND METHOD FOR PRODUCING SEMICONDUCTOR DEVICE

(71) Applicant: Resonac Corporation, Tokyo (JP)

(72) Inventors: Shogo Sobue, Tokyo (JP); Yuki Nakamura, Tokyo (JP); Saeko Ogawa, Tokyo (JP); Daisuke Ikeda, Tokyo (JP); Keisuke Okawara, Tokyo (JP)

( * ) Notice: Subject to any disclaimer, the term of this patent is extended or adjusted under 35 U.S.C. 154(b) by 484 days.

(21) Appl. No.: 18/255,366

(22) PCT Filed: Dec. 3, 2021

(86) PCT No.: PCT/JP2021/044553
§ 371 (c)(1),
(2) Date: Jun. 1, 2023

(87) PCT Pub. No.: WO2022/118969
PCT Pub. Date: Jun. 9, 2022

(65) Prior Publication Data
US 2024/0021443 A1     Jan. 18, 2024

(30) Foreign Application Priority Data

Dec. 4, 2020 (WO) .................. PCT/JP2020/045339

(51) Int. Cl.
*H10W 74/01* (2026.01)
*H10P 72/70* (2026.01)
(Continued)

(52) U.S. Cl.
CPC ........... *H10W 74/019* (2026.01); *H10P 72/74* (2026.01); *H10W 74/014* (2026.01);
(Continued)

(58) Field of Classification Search
CPC . H01L 21/568; H01L 21/561; H01L 21/6835; H01L 23/295; H01L 23/3128;
(Continued)

(56) References Cited

U.S. PATENT DOCUMENTS 6,794,273 B2 * 9/2004 Saito ................. H01L 23/49822
257/E21.705
7,855,245 B2 * 12/2010 Honda .................. H01L 23/295
524/106
(Continued)

FOREIGN PATENT DOCUMENTS

JP 2003-306653 10/2003
JP 2006-222164 8/2006
(Continued)

OTHER PUBLICATIONS

International Search Report dated Mar. 2, 2021 for PCT/JP2020/045336.
(Continued)

*Primary Examiner* — Vu A Vu
(74) *Attorney, Agent, or Firm* — SHIPWAY IP

(57) ABSTRACT

A method for producing a semiconductor device, including forming a temporary fixing laminated body including a carrier, and a sealing structure body provided on a main surface of the carrier, and removing the carrier from the temporary fixing laminated body. The temporary fixing laminated body is formed by a method including adhering the curable resin film and the carrier. The carrier is removed from the temporary fixing laminated body by separating a protective layer that is the curable resin film that is cured from the carrier. The curable resin film exhibits a transmittance of 20% or less with respect to light at a wavelength of 355 nm when cured.

18 Claims, 9 Drawing Sheets

(51) Int. Cl.

| | |
|---|---|
| *H10W 74/10* | (2026.01) |
| *H10W 74/47* | (2026.01) |
| *H10W 70/09* | (2026.01) |
| *H10W 70/652* | (2026.01) |
| *H10W 72/00* | (2026.01) |

(52) U.S. Cl.

CPC ........ *H10W 74/117* (2026.01); *H10W 74/121* (2026.01); *H10W 74/473* (2026.01); *H10P 72/743* (2026.01); *H10P 72/7438* (2026.01); *H10W 70/09* (2026.01); *H10W 70/6528* (2026.01); *H10W 72/0198* (2026.01)

(58) Field of Classification Search

CPC ..... H01L 23/3135; H01L 24/19; H01L 24/20; H01L 24/95; H01L 2221/68359; H01L 2221/68377; H01L 2224/19; H01L 2224/214; H01L 2224/95001; H01L 2221/68331; H01L 2221/68345; H01L 23/12; H01L 21/78; H01L 23/544; H01L 2221/68381; C08G 59/38; C08G 59/686; C09D 133/068

USPC ......................................................... 438/110

See application file for complete search history.

(56) References Cited

U.S. PATENT DOCUMENTS

| | | | | |
|---|---|---|---|---|
| 8,580,619 | B2 * | 11/2013 | Oda | ...................... H01L 21/561 438/118 |
| 8,956,887 | B2 * | 2/2015 | Sorimachi | .......... H10H 20/8514 438/33 |
| 10,008,642 | B2 * | 6/2018 | Seo | ...................... H10H 20/831 |
| 10,115,613 | B2 * | 10/2018 | Chang | ................... H01L 21/568 |
| 11,075,118 | B2 * | 7/2021 | Seddon | ............. H01L 21/30655 |
| 11,226,419 | B2 * | 1/2022 | Ono | ........................ A61B 6/461 |
| 11,251,169 | B2 * | 2/2022 | Lee | ..................... H01L 23/3128 |
| 12,095,014 | B2 * | 9/2024 | Hashimoto | .......... H10H 20/853 |
| 2013/0078770 | A1 | 3/2013 | Oda et al. | |
| 2013/0157419 | A1 * | 6/2013 | Shimizu | ................ H01L 21/568 438/127 |
| 2017/0032979 | A1 | 2/2017 | Morita et al. | |
| 2017/0294463 | A1 | 10/2017 | Yamazaki et al. | |

FOREIGN PATENT DOCUMENTS

| | | |
|---|---|---|
| JP | 2011-029585 | 2/2011 |
| JP | 2013-074184 | 4/2013 |
| JP | 2016-139754 | 8/2016 |
| JP | 2018-009138 | 1/2018 |
| JP | 2019-129179 | 8/2019 |
| JP | 2020-105276 | 7/2020 |
| TW | 201922995 | 6/2019 |
| TW | 202004874 | 1/2020 |
| TW | 202039761 | 11/2020 |

OTHER PUBLICATIONS

International Search Report dated Mar. 2, 2021 for PCT/JP2020/045339.

International Search Report dated Feb. 15, 2022 for PCT/JP2021/044553.

International Search Report dated Feb. 8, 2022 for PCT/JP2021/044561.

International Preliminary Report on Patentability with Written Opinion dated Jun. 15, 2023 for PCT/JP2021/044553.

International Preliminary Report on Patentability with Written Opinion dated Jun. 15, 2023 for PCT/JP2021/044561.

SOEI Patent and Law Firm, Statement of Related Matters, dated Jul. 31, 2023.

* cited by examiner (a)

(b)

(c)

(d)

(a)

(b)

(c)

(d)

(a)

(b)

(c)

(d)

(a)

(b)

(c)

(d)

(e)

CURABLE RESIN FILM, FILM MATERIAL FOR SEMICONDUCTOR DEVICE PRODUCTION, CURABLE RESIN COMPOSITION FOR SEMICONDUCTOR DEVICE PRODUCTION, AND METHOD FOR PRODUCING SEMICONDUCTOR DEVICE

CROSS-REFERENCE TO RELATED APPLICATIONS

This application is a 35 U.S.C. § 371 national phase application of PCT/JP2021/044553, filed on Dec. 3, 2021, which claims priority to International Patent Application No. PCT/JP2020/045339, filed on Dec. 4, 2020.

TECHNICAL FIELD

The present disclosure relates to a curable resin film, a film material for semiconductor device production, a curable resin composition for semiconductor device production, and a method for producing a semiconductor device.

BACKGROUND ART

A method for manufacturing a semiconductor device such as a fan-out package includes steps such as the processing of a semiconductor chip and the formation of a re-distribution layer (RDL), and such steps may be performed in a state where the semiconductor chip is temporarily fixed to a carrier.

CITATION LIST

Patent Literature

Patent Literature 1: Japanese Unexamined Patent Publication No. 2003-306653

SUMMARY OF INVENTION

Technical Problem

The present disclosure relates to a method for efficiently manufacturing a semiconductor device by a method including temporarily fixing a semiconductor chip to a carrier, and a curable resin film used therefor.

Solution to Problem

One aspect of the present disclosure relates to a curable resin film used for manufacturing a semiconductor device and having tackiness. The curable resin film exhibits a transmittance of 20% or less with respect to light at a wavelength of 355 nm. The semiconductor device is manufactured by a method including forming a temporary fixing laminated body including a carrier, and a sealing structure body including a plurality of semiconductor chips and a sealing portion sealing the plurality of semiconductor chips, and removing the carrier from the temporary fixing laminated body. The semiconductor chip includes a chip main body having a first surface and a second surface on a side opposite to the first surface, and a connection terminal provided on the first surface. The sealing portion includes an integrated protective layer covering the second surface of the plurality of semiconductor chips, and a sealing material layer sealing the plurality of semiconductor chips together with the protective layer. The protective layer is a cured curable resin film that is cured. The temporary fixing laminated body is formed by a method including adhering the curable resin film and the carrier. The carrier is removed from the temporary fixing laminated body by separating the protective layer from the carrier.

Another aspect of the present disclosure relates to a film material for semiconductor device production, including a support film, and the curable resin film described above, provided on the support film.

Still another aspect of the present disclosure relates to a curable resin composition for semiconductor device production, used for forming the curable resin film described above and comprising a light absorbing agent.

Still another aspect of the present disclosure relates to a method for producing a semiconductor device by the method described above.

Advantageous Effects of Invention

According to an aspect of the present disclosure, it is possible to efficiently manufacture the semiconductor device by the method including temporarily fixing the semiconductor chip to the carrier.

DESCRIPTION OF EMBODIMENTS

Figure 1:
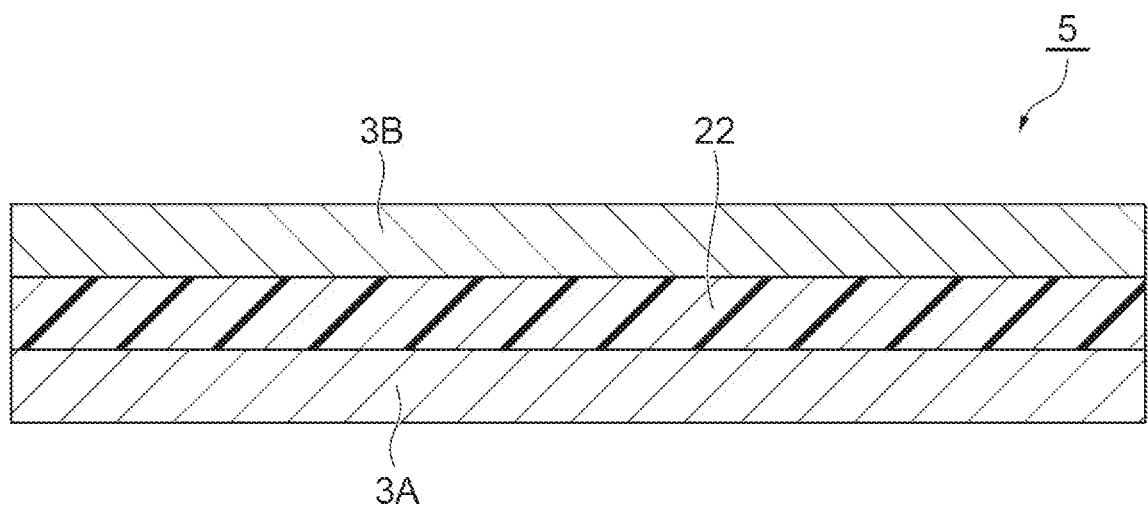
FIG. 1 is a sectional view illustrating an embodiment of a film material including a curable resin film.

Hereinafter, several embodiments of the present disclosure will be described in detail, with reference to the drawings, as necessary. However, the present disclosure is not limited to the following embodiment. In the following description, the same reference numerals will be applied to the same or corresponding parts, and the repeated description may be omitted. A positional relationship such as the left, right, top, and bottom is based on a positional relationship illustrated in the drawings, unless otherwise specified. A dimension ratio in the drawings is not limited to the illustrated ratio. A numerical range represented by using "to" indicates a range including the minimum value and the maximum value.

FIG. 1 is a sectional view illustrating an embodiment of a film material including a curable resin film. A film material 5 illustrated in FIG. 1 includes a support film 3A, a curable resin film 22 provided on the support film 3A, and a protective film 3B covering the surface of the curable resin film 22 on a side opposite to the support film 3A.

The curable resin film 22 may have tackiness. The curable resin film 22 may have tackiness to the extent that the curable resin film 22 can be adhered to a glass substrate in an environment of 25° C. The curable resin film 22 with tackiness can be adhered to a carrier described below with a temperature condition of a room temperature or a comparatively low temperature. In addition, a semiconductor chip can be disposed at a predetermined position on the curable resin film 22 at a comparatively low temperature.

When the curable resin film 22 is adhered to the glass substrate with a temperature condition of 25° C., a 90-degree peeling strength between the curable resin film 22 and the glass substrate may be 10 N/m or more, 20 N/m or more, 30 N/m or more, or 40 N/m or more, and may be 200 N/m or less, at 25° C. The "temperature condition of 25° C." indicates a condition in which the temperature of the curable resin film 22 and the glass substrate is 25° C.

When the curable resin film 22 adhered to the glass substrate is cured, and then, the cured curable resin film 22 is irradiated with laser light from the glass substrate side, a bonding adhesive strength between the curable resin film 22 and the glass substrate may be 5 MPa or less.

The curable resin film 22 can be a film with low light transmissivity. Specifically, the transmittance of the curable resin film 22 after curing with respect to light at a wavelength of 355 nm may be 20% or less, 15% or less, 10% or less, 9% or less, 8% or less, 7% or less, 6% or less, 5% or less, 4% or less, 3% or less, 2% or less, 1% or less, or 0.5% or less, and may be 0% or more. Since the curable resin film 22 with low light transmissivity efficiently absorbs light, it is possible to easily separate the curable resin film 22 from the carrier by the irradiation of the light (for example, laser). Here, the transmittance indicates a ratio of the intensity of transmitted light to the intensity of incident light when light having a predetermined wavelength is incident on the curable resin film 22 from one main surface side. The light transmittance of the curable resin film 22 before curing with respect to light at a wavelength of 355 nm may be 20% or less, 15% or less, 10% or less, 9% or less, 8% or less, 7% or less, 6% or less, 5% or less, 4% or less, 3% or less, 2% or less, 1% or less, or 0.5% or less, and may be 0% or more.

A shear viscosity of the curable resin film 22 may be 5000 Pa·s or more, 6000 Pa·s or more, 7000 Pa·s or more, or 8000 Pa·s or more, and may be 100000 Pa·s or less, 90000 Pa·s or less, or 80000 Pa·s or less, at 100° C. In a case where the shear viscosity of the curable resin film 22 is in such a range, a sufficient effect of retaining an adherend is particularly easily obtained.

A storage modulus of the curable resin film 22 after curing may be 300 MPa or more, 400 MPa or more, or 500 MPa or more, and may be 6000 MPa or less, 5500 MPa or less, or 5000 MPa or less, at 25° C. The storage modulus of the curable resin film 22 after curing may be 0.1 MPa or more, 0.5 MPa or more, or 1.0 MPa or more, and may be 200 MPa or less, 190 MPa or less, 180 MPa or less, 170 MPa or less, 160 MPa or less, 150 MPa or less, 140 MPa or less, 130 MPa or less, or less, or 120 MPa or less, at 250° C. In a case where the storage modulus of the curable resin film 22 after curing is in such a range, a sufficient effect of protecting a semiconductor element is obtained.

The curable resin film 22 may contain a light absorbing agent. The curable resin film containing the light absorbing agent can be likely to have sufficiently low light transmissivity. The light absorbing agent may be a material that absorbs the laser light to produce heat. The light absorbing agent may be a black pigment or dye. Specific examples of the light absorbing agent include carbon black, aluminum, nickel, and titanium oxide.

The content of the light absorbing agent, for example, can be in a range in which the transmittance of the curable resin film 22 with respect to light at a wavelength of 355 nm is 20% or less. Specifically, the content of the light absorbing agent may be 0.1% by mass or more, or 1% by mass or more, and may be 30% by mass or less, 25% by mass or less, 20% by mass or less, 15% by mass or less, 10% by mass or less, or 5% by mass or less, on the basis of the mass of the curable resin film 22.

The curable resin film 22 may contain a thermoplastic resin. The curable resin film 22 containing the thermoplastic resin with a low glass transition temperature easily forms a semiconductor device in which warpage is suppressed. From such a viewpoint, the glass transition temperature of the thermoplastic resin may be −40° C. or higher and 40° C. or lower or 30° C. or lower, and may be −30° C. or higher and 40° C. or lower or 30° C. or lower. In a case where the glass transition temperature of the thermoplastic resin is 40° C. or lower or 30° C. or lower, there is a tendency that the curable resin film is likely to have suitable flexibility and suitable adhering properties with respect to the adherend. In a case where the glass transition temperature of the thermoplastic resin film is −40° C. or higher or −30° C. or higher, there is a tendency that the uncured curable resin film is likely to have suitable tackiness and suitable handleability.

The thermoplastic resin may have a reactive group. The reactive group of the thermoplastic resin, for example, may be an epoxy group. Since the epoxy group makes it comparatively difficult for a crosslinking reaction to progress, there is a tendency that it is possible to suppress the gelation of a varnish for forming a thermosetting resin film and a decrease in a bonding adhesive force with respect to the adherend due to an unintended increase in a curing degree of the curable resin film.

The thermoplastic resin may be a (meth)acrylic copolymer, or may be a (meth)acrylic copolymer having a reactive group. In this specification, "(meth)acryl" is used as the term indicating acryl or methacryl. The same applies to other similar expressions.

The (meth)acrylic copolymer is a copolymer containing a (meth)acrylic monomer having a (meth)acryloyl group, as a monomer unit. The (meth)acrylic copolymer may be a copolymer containing a (meth)acrylic monomer forming a homopolymer with a glass transition temperature of 50° C. or higher, a (meth)acrylic monomer forming a homopolymer with a glass transition temperature of 0° C. or lower, and a (meth)acrylic monomer having an epoxy group, as a monomer unit. A glass transition temperature of a homopolymer formed by the (meth)acrylic monomer having an epoxy group is not limited. The (meth)acrylic monomer forming the homopolymer with the glass transition temperature of 50° C. or higher and the (meth)acrylic monomer forming the homopolymer with the glass transition temperature of 0° C. or lower can be a monomer not having an epoxy group.

A weight average molecular weight of the thermoplastic resin may be 200000 or more and 1000000 or less. Here, the weight average molecular weight can be a value in terms of standard polystyrene, which is measured by gel permeation chromatography. In a case where the weight average molecular weight of the thermoplastic resin is in such a range, there is a tendency that the curable resin film is likely to be stably formed, and there is a tendency that the curable resin film is likely to have a suitable strength, suitable flexibility, and suitable tackiness. Further, there is also a tendency that the curable resin film is likely to have excellent handleability and excellent heat resistance. In addition, in a case where the weight average molecular weight of the thermoplastic resin is 1000000 or less, suitable fluidity is easily obtained.

The content of the thermoplastic resin may be 10 to 80% by mass, on the basis of the mass of the curable resin film 22. In a case where the content of the thermoplastic resin is 10% by mass or more, there is a tendency that the handleability of the curable resin film at a high temperature is improved. In a case where the content of the thermoplastic resin is 80% by mass or less, since the curable resin film after curing is likely to have a suitably high elastic modulus, high reliability is easily obtained.

The curable resin film 22 may further contain a curable resin that is a compound having a reactive group. The curable resin may be an epoxy resin having two or more epoxy groups, and examples thereof include a bisphenol A-type epoxy resin, a bisphenol F-type epoxy resin, a phenol novolac-type epoxy resin, and a cresol novolac-type epoxy resin. Two or more types of epoxy resins selected therefrom may be used together. A molecular weight of the curable resin may be 3000 or less. The curable resin film 22 containing the curable resin is likely to have curing properties and suitable tackiness.

The content of the curable resin may be 1% by mass or more and 50% by mass or less or 40% by mass or less, and may be 5% by mass or more and 50% by mass or less or 40% by mass or less, on the basis of the mass of the curable resin film 22. In a case where the content of the curable resin is in such a range, the semiconductor device is particularly likely to be stably and efficiently manufactured. In a case where the content of the curable resin is 1% by mass or more or 5% by mass or more, a bonding adhesive force of the curable resin film with respect to the semiconductor chip is improved, and as a result thereof, there is a tendency that the reliability of the semiconductor device to be manufactured is improved. In a case where the content of the curable resin is 50% by mass or less or 40% by mass, there is a tendency that the excessive flow of the curable resin film can be suppressed.

The curable resin film 22 may further contain a silica filler. The content of the silica filler may be 1 to 60% by mass, or 5 to 60% by mass, on the basis of the mass of the curable resin film 22. In a protective layer formed by curing the curable resin film 22 containing the silica filler, it is possible to particularly easily engrave the surface by the irradiation of laser light. In a case where the content of the silica filler is 60% by weight or less, the curable resin film after curing is likely to have a suitable storage modulus, and particularly excellent bonding adhesiveness is easily exhibited.

The curable resin film 22 may further contain a curing agent reacting with any one or both of the reactive group of the thermoplastic resin and the reactive group of the curable resin. The curing agent, for example, may be a phenolic resin. In a case where the curable resin film 22 contains the curing agent, the curable resin film may further contain a curing accelerator accelerating the reaction of the curing agent. For example, in a case where the curing agent is the phenolic resin, the curing accelerator may be an imidazole compound.

The curable resin film 22 may not substantially contain a silicone compound having a polysiloxane chain. The curable resin film not containing the silicone compound is likely to have excellent bonding adhesiveness with respect to the semiconductor chip after curing. Specifically, the content of the silicone compound may be less than 1.0 part by mass, less than 0.9 parts by mass, or less than 0.8 parts by mass, with respect to 100 parts by mass of the thermoplastic resin.

The thickness of the curable resin film 22, for example, may be 10 to 400 µm.

The support film 3A and the protective film 3B, for example, may be a thermoplastic resin film such as a polyethylene terephthalate film. The thickness of the support film 3A and the protective film 3B may be 10 to 150 µm.

The film material 5, for example, can be obtained by a method including coating the support film 3A with a varnish containing a curable resin composition containing the components configuring the curable resin film 22 described above, and a solvent, forming the curable resin film 22 by removing the solvent from the coated film on the support film 3A, and laminating the protective film 3B on the surface of the curable resin film 22 on a side opposite to the support film 3A.

The film material and the curable resin film exemplified above can be used to manufacture the semiconductor device by a method including forming a temporary fixing laminated body including the carrier, and a sealing structure body provided on the main surface of the carrier, and removing the carrier from the temporary fixing laminated body.

Figure 2:
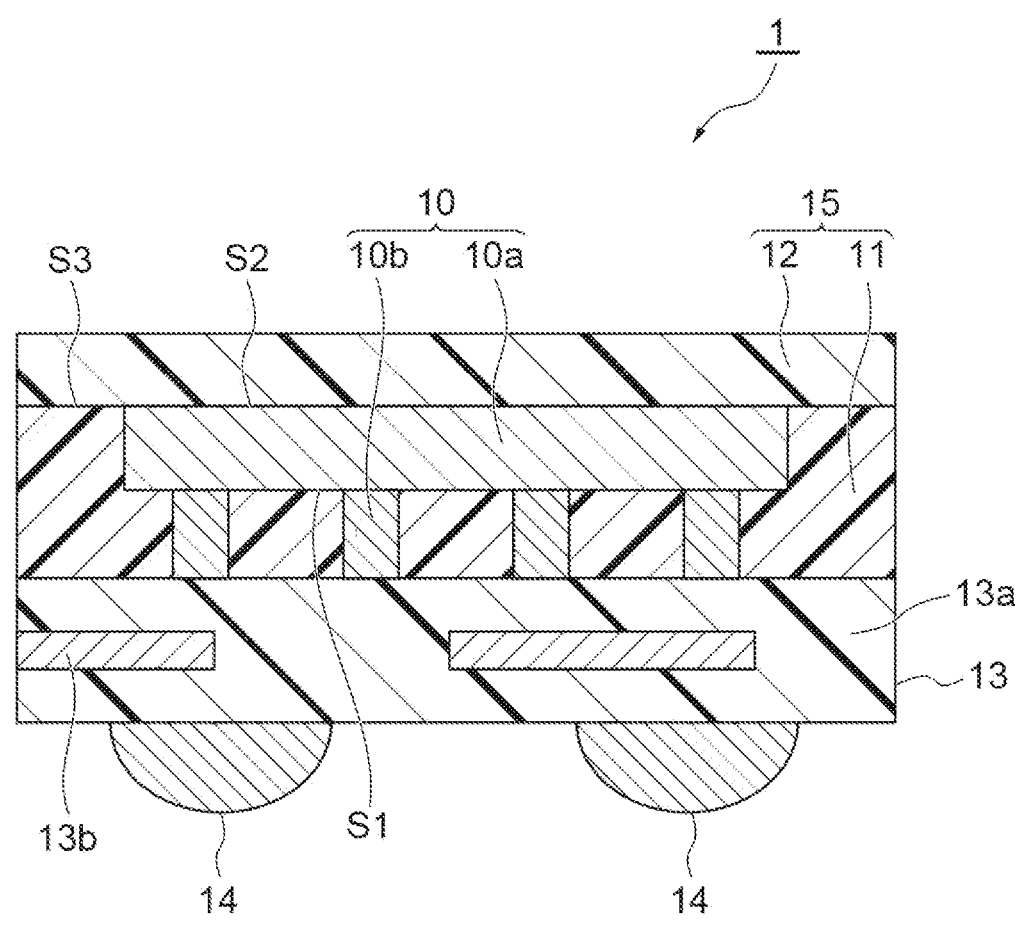
FIG. 2 is a sectional view illustrating an embodiment of a semiconductor device.

FIG. 2 is a sectional view schematically illustrating an example of a semiconductor device that can be manufactured by using the curable resin film 22. A semiconductor device 1 illustrated in FIG. 2 is a device having a fan-out package (FO-PKG) structure, and includes a semiconductor chip 10, a sealing portion 15 sealing the semiconductor chip 10, a re-distribution layer 13, and a solder ball 14. The semiconductor chip 10 includes a chip main body 10a including a first surface S1 and a second surface S2 on a side opposite to the first surface S1, and a connection terminal 10b provided on the first surface S1. The re-distribution layer 13 is a layer for widening a terminal pitch of the connection terminal 10b, and for example, includes an insulating layer 13a containing polyimide and the like, and a wiring 13b such as a copper wiring. The terminal pitch of the connection terminal 10b is widened by the pitch conversion of the re-distribution layer 13. The solder ball 14 is connected to the terminal of which the terminal pitch is widened by the re-distribution layer 13.

The sealing portion 15 includes a sealing material layer 11 covering a portion other than the second surface S2 in the surface of the semiconductor chip 10, and a protective layer 12 covering the second surface S2, and seals the semiconductor chip 10 on the re-distribution layer 13. The protective layer 12 can be a cured product of the curable resin film 22 according to the embodiment described above. A surface S3 of the sealing material layer 11 on a side opposite to the re-distribution layer 13 forms a flat surface together with the second surface S2 of the semiconductor chip 10, and the protective layer 12 extends to cover the entire flat surface. The protective layer 12 can be a permanent film configuring the semiconductor device without being removed after the semiconductor device is manufactured.

Figure 3:
FIGS. 3(*a*), (*b*), (*c*), and (*d*) are process charts illustrating an embodiment of a method for manufacturing a semiconductor device.
Figure 3:
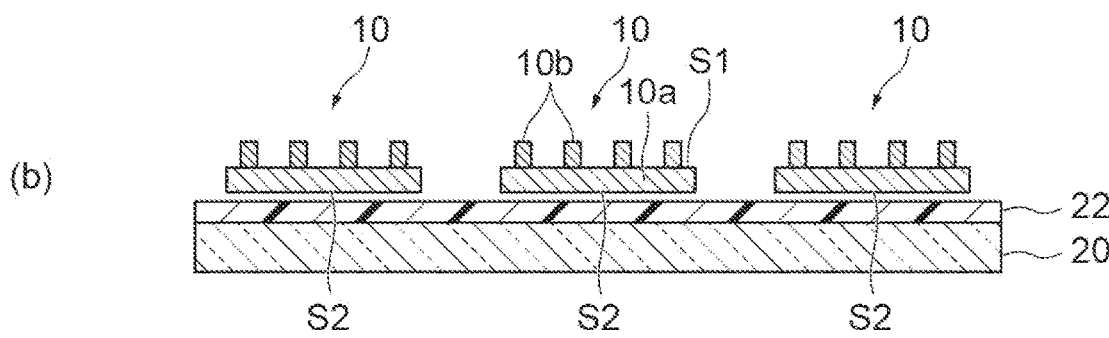
Figure 3:
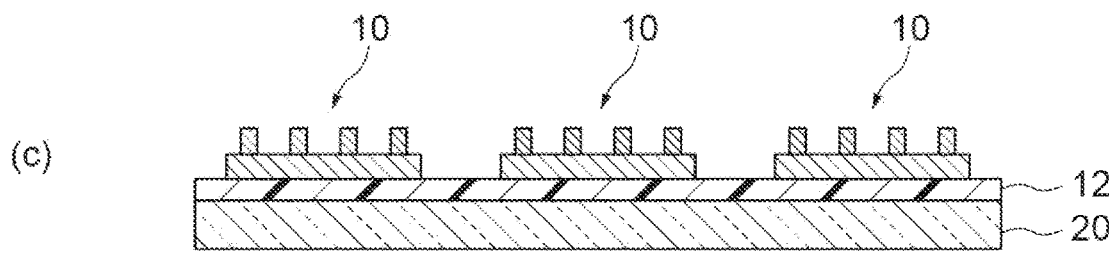
Figure 3:
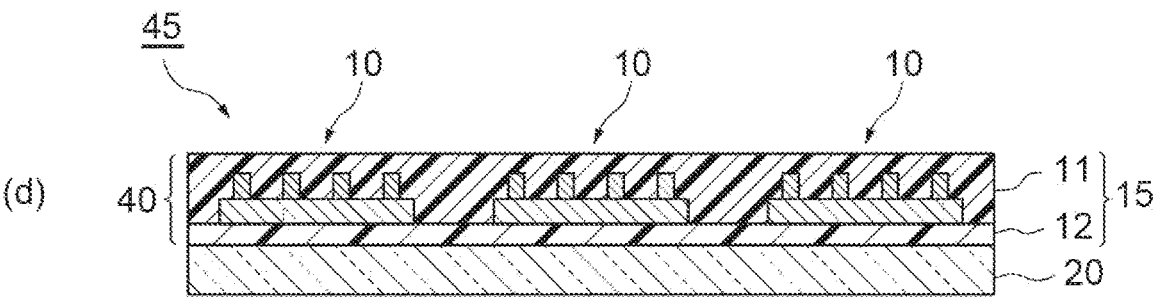
Figure 4:
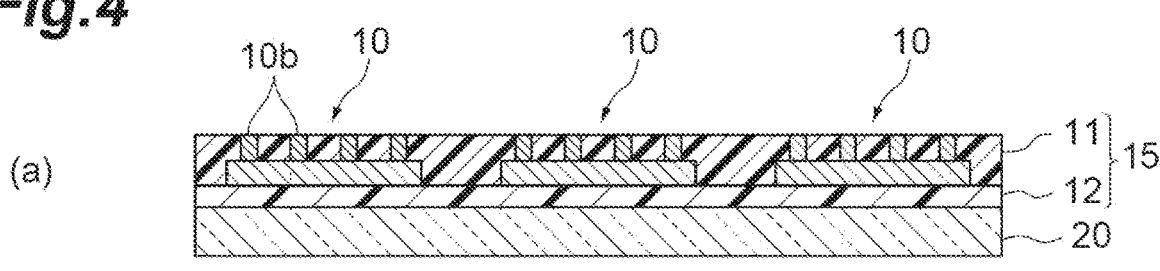
FIGS. 4(*a*), (*b*), (*c*), and (*d*) are process charts illustrating an embodiment of the method for manufacturing a semiconductor device.
Figure 4:
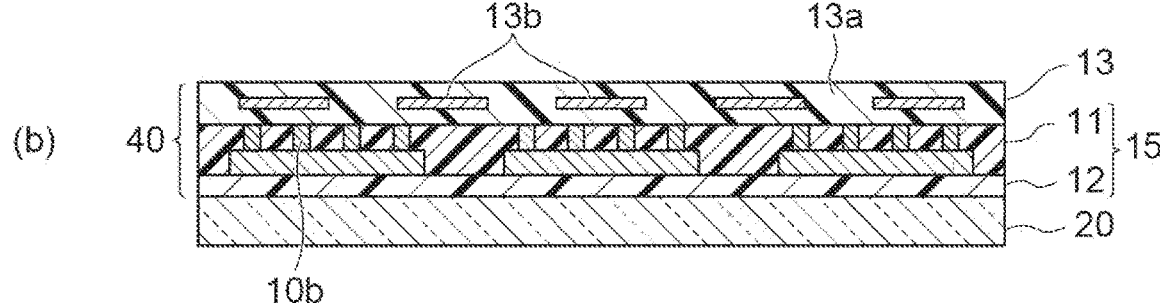
Figure 4:
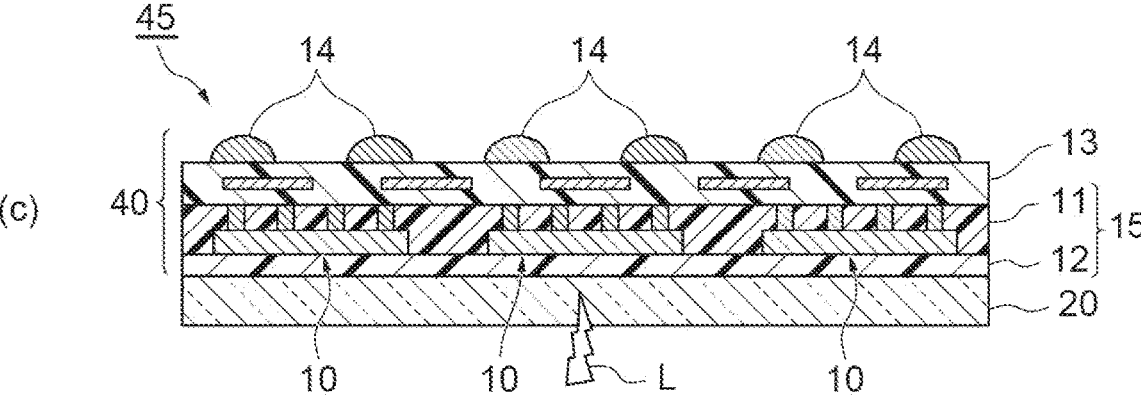
Figure 4:
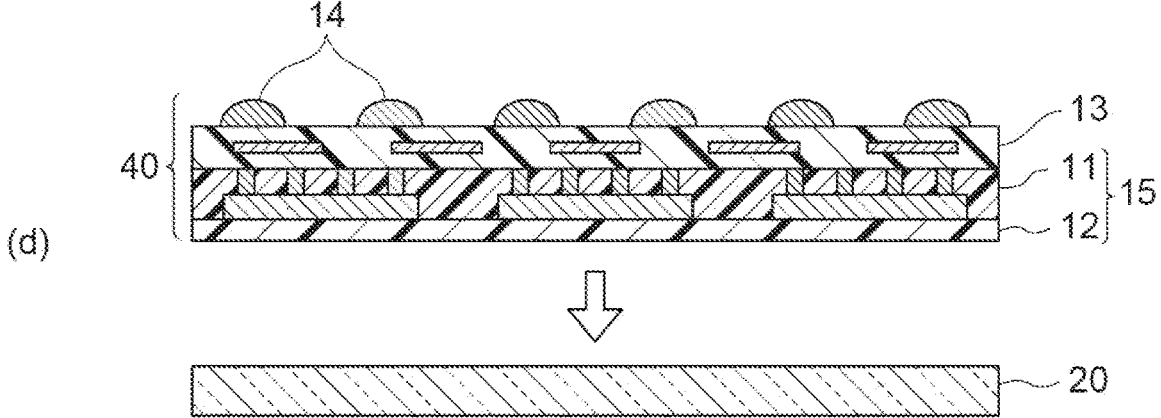
Figure 5:
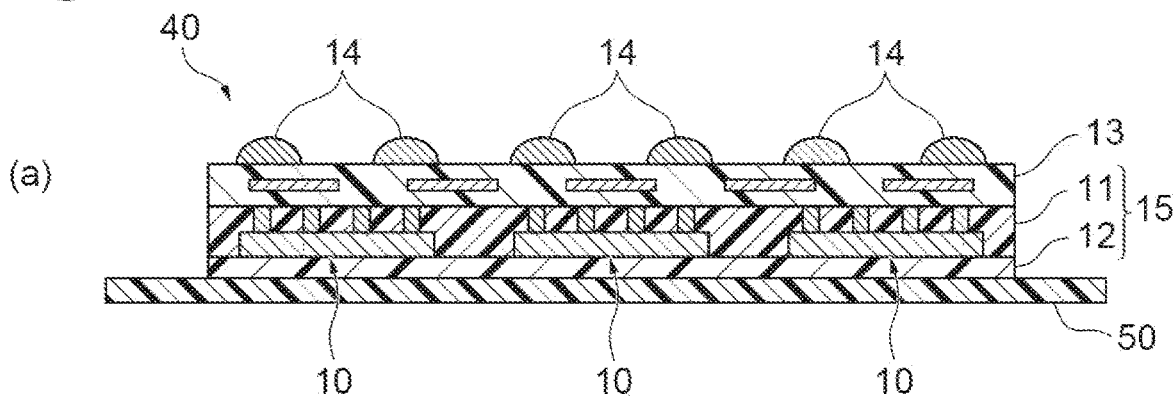
FIGS. 5(*a*), (*b*), (*c*), and (*d*) are process charts illustrating an embodiment of the method for manufacturing a semiconductor device.
Figure 5:
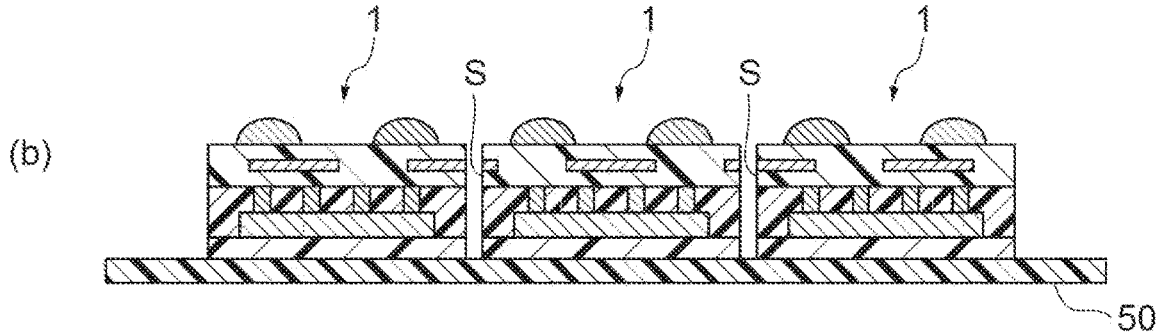
Figure 5:
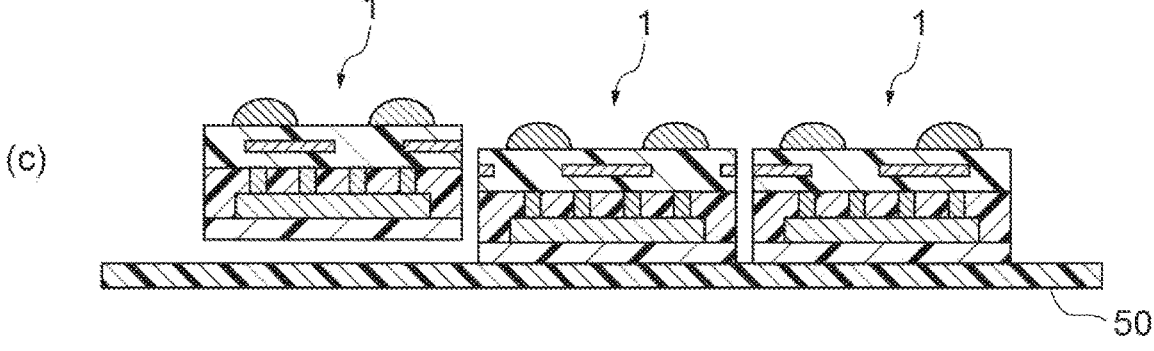
Figure 5:
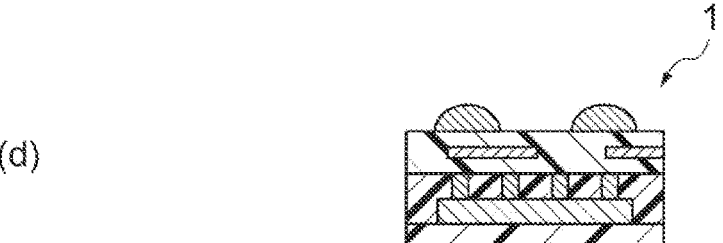

FIG. 3, FIG. 4, and FIG. 5 are process charts illustrating an example of a method for manufacturing the semiconductor device 1. The method illustrated in FIGS. 3 to 5 includes forming a temporary fixing laminated body 45 (FIG. 3(*d*)) including a carrier 20, and a sealing structure body 40 provided on the main surface of the carrier 20, and removing the carrier 20 from the temporary fixing laminated body 45. As illustrated in FIGS. 3(*a*) to (*d*), the temporary fixing laminated body 45 can be formed by a method including adhering the curable resin film 22 and the carrier 20, disposing a plurality of semiconductor chips 10 on the surface of the curable resin film 22 on a side opposite to the carrier 20, in a direction in which the second surface S2 is in contact with the curable resin film 22, forming the protective layer 12 that is the cured curable resin film by curing the curable resin film 22, fixing the plurality of semiconductor chips 10 onto the protective layer 12, and forming the sealing portion 15 including the protective layer 12 and the sealing material layer 11 by forming the sealing material layer 11 on the protective layer 12 and on the semiconductor chip 10.

The protective film 3B may be peeled off from the film material 5 exemplified in FIG. 1, the exposed curable resin film 22 may be adhered to the carrier 20, and then, the support film 3A may be peeled off from the curable resin film 22. The curable resin film 22 and the carrier 20 may be adhered with a temperature condition of 20 to 120° C. The "temperature condition of 20 to 120° C." indicates a condition in which the temperature of the curable resin film 22 and the carrier 20 is in a range of 20 to 120° C. Such a temperature condition may be 40 to 100° C. A laminated body of the curable resin film 22 and the carrier 20 may be pressurized to be adhered, and a pressure for such pressurization, for example, may be 0.01 to 1 MPa.

The carrier 20, for example, may be a glass substrate or a transparent resin substrate. The thickness of the carrier 20, for example, may be 0.1 to 2.0 mm.

The plurality of semiconductor chips 10 are disposed at a predetermined position on the curable resin film 22 adhered to the carrier 20, in a direction in which the second surface S2 is in contact with the curable resin film 22, that is, in a face-up direction. The semiconductor chip 10 may be disposed on the curable resin film 22 while heating any one or both of the curable resin film 22 and the semiconductor chip 10. A heating temperature, for example, may be 20 to 120° C., or 60 to 100° C. The semiconductor chip 10 placed on the curable resin film 22 may be pressurized, and a pressure for such pressurization may be 0.01 to 1.0 MPa, or 0.1 to 0.2 MPa. A pressurization time, for example, may be 0.01 to 10 seconds, or 0.1 to 2 seconds.

Subsequently, as illustrated in FIG. 3(*c*), the integrated protective layer 12 (the cured curable resin film) covering the second surfaces S2 of all of the plurality of semiconductor chips 10 is formed by curing the curable resin film 22 with at least one of heat and light. The semiconductor chip 10 is fixed to the carrier 20 through the formed protective layer 12. In this case, a bonding adhesive strength between the protective layer 12 and the carrier 20 may be 1 MPa or more.

As illustrated in FIG. 3(*d*), the sealing material layer 11 collectively sealing the plurality of semiconductor chips 10 is formed on the protective layer 12. The sealing material layer 11 can be formed by using a sealing material generally used for sealing the semiconductor chip. The sealing material may be a thermosetting resin composition containing an epoxy resin. The semiconductor chip 10 is included in the sealing portion 15 including the sealing material layer 11 and the protective layer 12. The sealing material layer 11 is formed by a general method such as a compression molding method. Since the semiconductor chip 10 is fixed to the protective layer 12, the displacement of the semiconductor chip 10 is less likely to occur while the sealing material layer 11 is formed.

As illustrated in FIG. 4 and FIG. 5, an embodiment of the method for manufacturing a semiconductor device may further include removing a part of the sealing material layer 11 by grinding the sealing material layer 11 from a side opposite to the protective layer 12, exposing the connection terminal 10*b*, forming the re-distribution layer 13 including the wiring 13*b* to be connected to the exposed connection terminal 10*b*, and the insulating layer 13*a* on the sealing material layer 11, providing the solder ball 14 to be connected to the wiring 13*b* on the surface of the re-distribution layer 13 on a side opposite to the sealing material layer 11, separating the protective layer 12 from the carrier 20 by irradiating the protective layer 12 with light L from the carrier 20 side, forming the singulated semiconductor device 1 by dividing the sealing structure body 40 including the plurality of semiconductor chips 10 on a dicing tape 50, and picking up the semiconductor device 1 from the dicing tape 50. In a case where the sealing structure body including the semiconductor chip 10 and the sealing material layer 11 but not the protective layer 12 is not supported on the carrier or the like, there is a possibility that a damage such as a crack due to interfacial peeling or the like between the semiconductor chip 10 and the sealing material layer 11 occurs. However, by providing the protective layer 12, a damage to the sealing structure body separated from the carrier in the manufacturing step can be suppressed.

The grinding of the protective layer 12, the formation of the re-distribution layer 13, and the formation of the solder ball can be performed by a general method.

The light L for separating the protective layer 12 from the carrier 20, for example, may be laser light. A light source of the laser light, for example, may be excimer laser. The wavelength of the laser light generated from the excimer laser, for example, can be 193 nm, 248 nm, 308 nm, 351 nm, or 532 nm. The surface of the protective layer 12 is modified by the irradiation of the laser light, and as a result thereof, a bonding adhesive force between the protective layer 12 and the carrier 20 decreases. For example, the bonding adhesive force between the protective layer 12 (the cured curable resin film) and the carrier 20 (for example, the glass substrate) after irradiation of the laser light may be 5.0 MPa or less.

By the irradiation of the laser light (for example, green laser), necessary information such as a product name may be engraved on the surface of the protective layer 12 on a side opposite to the semiconductor chip 10. The exposed surface of the protective layer 12 may be cleaned, as necessary.

As illustrated in FIG. 5, a step of forming the singulated semiconductor device 1 may include adhering the dicing tape 50 to the protective layer 12, forming a plurality of semiconductor devices 1 by cutting the sealing structure body 40 including the plurality of semiconductor chips 10, the sealing portion 15 including the protective layer 12, the re-distribution layer 13, and the solder ball 14 at a predetermined spot S, and picking up the semiconductor device 1 from the dicing tape 50.

Figure 6:
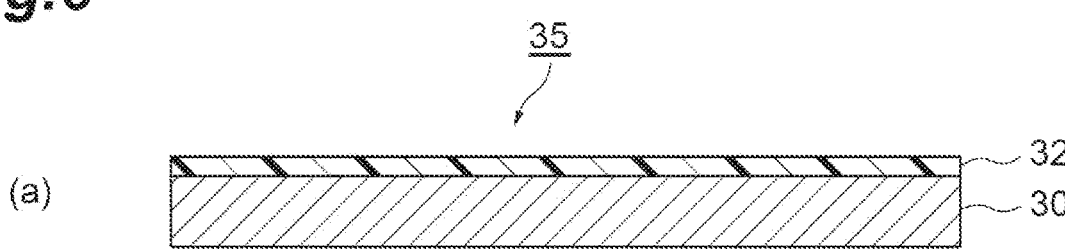
FIGS. 6(*a*), (*b*), (*c*), and (*d*) are process charts illustrating an embodiment of the method for manufacturing a semiconductor device.
Figure 6:
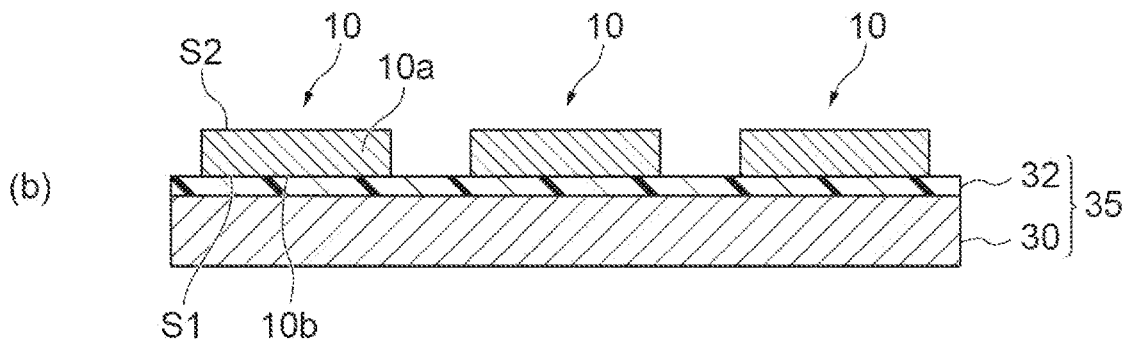
Figure 6:
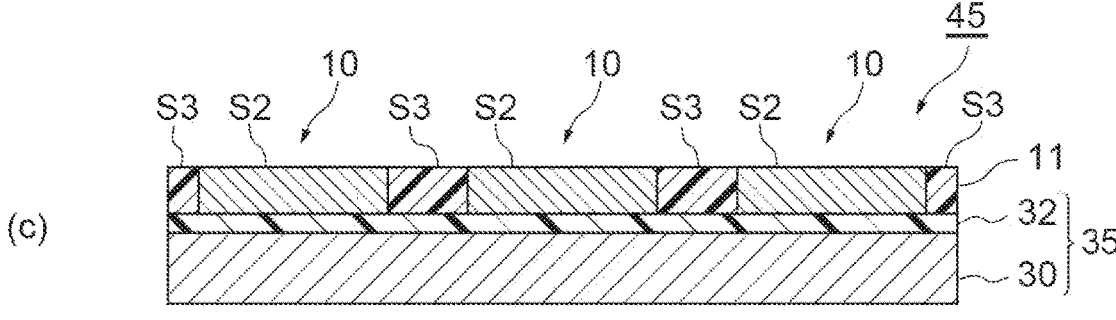
Figure 6:
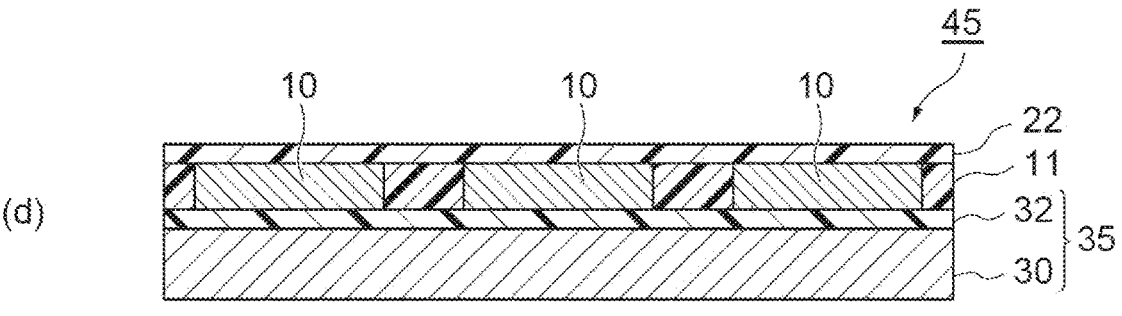
Figure 7:
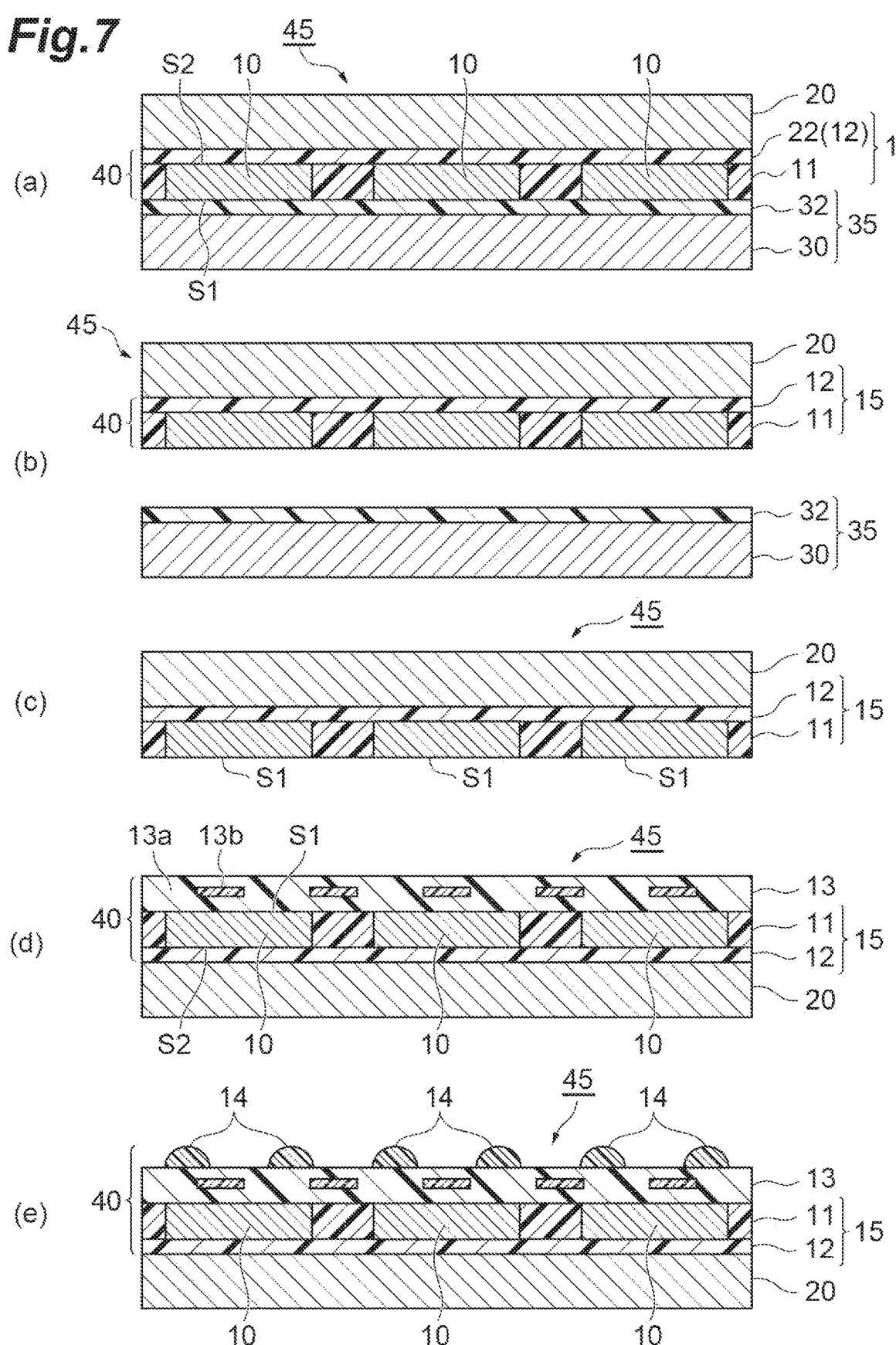
FIGS. 7(*a*), (*b*), (*c*), (*d*), and (*e*) are process charts illustrating an embodiment of the method for manufacturing a semiconductor device.
Figure 8:
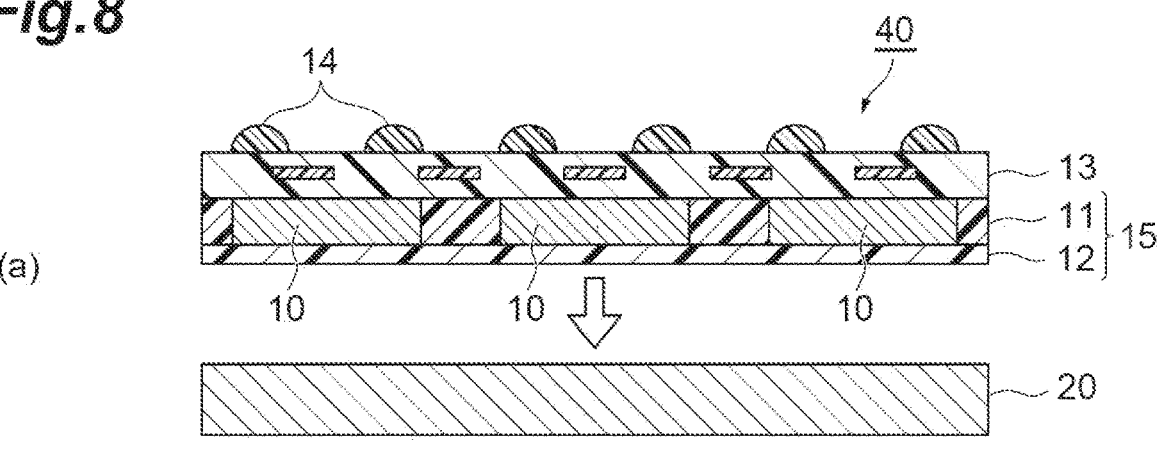
FIGS. 8(*a*), (*b*), (*c*), (*d*), and (*e*) are process charts illustrating an embodiment of the method for manufacturing a semiconductor device.
Figure 8:
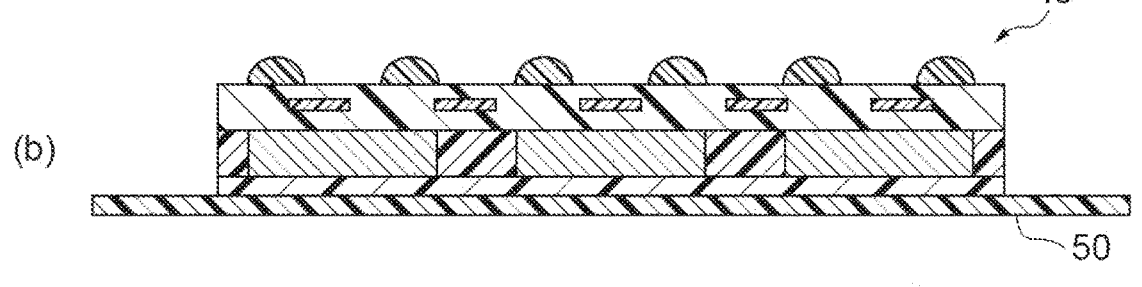
Figure 8:
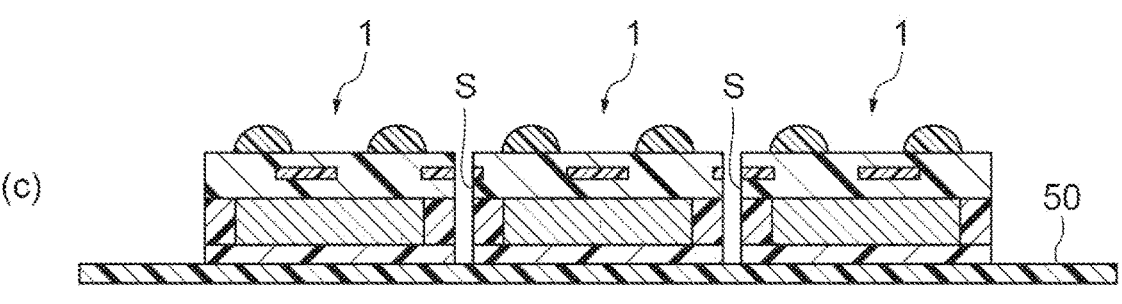
Figure 8:
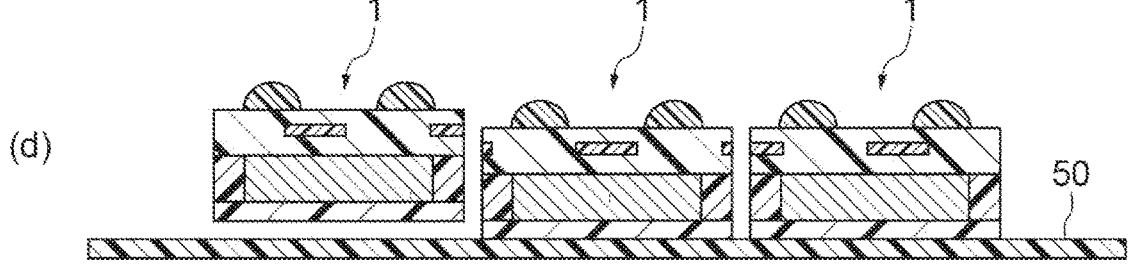
Figure 8:
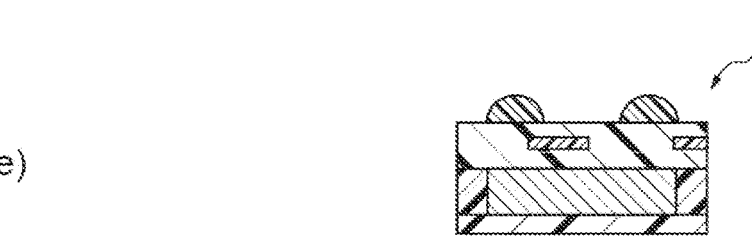

FIG. 6, FIG. 7, and FIG. 8 are process charts illustrating another example of the method for manufacturing the semiconductor device 1. The method illustrated in FIGS. 6 to 8 includes forming the temporary fixing laminated body 45 (FIG. 7(*e*)) including the carrier 20, and the sealing structure body 40 provided on the main surface of the carrier 20, and removing the carrier 20 from the temporary fixing laminated body 45. As illustrated in FIGS. 6(*a*) to (*d*) and FIGS. 7(*a*)

to (c), the temporary fixing laminated body 45 can be formed by a method further including preparing a temporary fixing material 35 including a carrier 30 and an adhesive layer 32 provided on the carrier 30, preparing the plurality of semiconductor chips 10 including the chip main body 10a including the first surface S1 and the second surface S2 on a side opposite to the first surface S1, and the connection terminal 10b provided on the second surface S2, forming the temporary fixing laminated body 45 (FIG. 6(c)) including the temporary fixing material 35, the plurality of semiconductor chips 10 temporarily fixed onto the temporary fixing material 35, in a direction in which the first surface S1 is directed toward the temporary fixing material 35 side, and the sealing material layer 11 collectively sealing the plurality of semiconductor chips 10 on the temporary fixing material 35, in which the second surface S2 of the plurality of semiconductor chips 10 is exposed from the sealing material layer 11, providing the curable resin film 22 covering the second surface S2 and the sealing material layer 11, adhering the curable resin film 22 and the carrier 20, and removing the temporary fixing material 35 from the temporary fixing laminated body 45, in this order.

The carrier 30 configuring the temporary fixing material 35, for example, may be a glass substrate. The adhesive layer 32 configuring the temporary fixing material 35, for example, may be a peeling sheet having an adhesive force at an ordinary temperature, in which the adhesive force is decreased by heating.

As illustrated in FIG. 6(b), the plurality of semiconductor chips 10 are disposed on the adhesive layer 32, in a direction in which the first surface S1 and the connection terminal 10b are positioned on the adhesive layer 32 side of the temporary fixing material 35, that is, in a face-down direction. After that, as illustrated in FIG. 6(c), the sealing material layer 11 sealing the semiconductor chip 10 is formed. The sealing material layer 11 is formed such that the second surface S2 of the semiconductor chip 10 is exposed from the sealing material layer 11. The sealing material layer 11 in which the entire semiconductor chip 10 including the second surface S2 is embedded is formed, and then, a part of the sealing material layer 11 is removed by grinding the sealing material layer 11 from a side opposite to the temporary fixing material 35 to form a flat surface to which the second surface S2 of the semiconductor chip 10 is exposed. The temporary fixing laminated body 45 in this stage includes the temporary fixing material 35, the plurality of semiconductor chips 10, and the sealing material layer 11.

Subsequently, as illustrated in FIG. 6(d), the curable resin film 22 covering the second surface S2 of the semiconductor chip 10 and the sealing material layer 11 is provided, and as illustrated in FIG. 7(a), the curable resin film 22 and the carrier 20 are adhered. A adhering condition can be the same as the condition of the method exemplified in FIG. 3. The integrated protective layer 12 (the cured curable resin film) covering the second surfaces S2 of all of the plurality of semiconductor chips 10 may be formed by curing the curable resin film 22 adhered to the carrier 20. The protective layer 12 and the sealing material layer 11 configure the sealing portion 15 sealing the semiconductor chip 10 on the temporary fixing material 35. The sealing structure body 40 includes the semiconductor chip 10 and the sealing portion 15. The temporary fixing laminated body 45 in this stage includes the temporary fixing material 35, the sealing structure body 40, and the carrier 20.

As illustrated in FIG. 7(b), the temporary fixing material 35 is removed from the temporary fixing laminated body 45. For example, the adhesive layer 32 may be heated, and the sealing structure body 40 may be separated from the adhesive layer 32 of which the adhesive force is decreased by heating.

By removing the temporary fixing material 35, the first surface S1 of the semiconductor chip 10 is exposed. The re-distribution layer 13 is formed on the exposed first surface S1. The re-distribution layer 13 includes the insulating layer 13a, and the wiring 13b provided in the insulating layer 13a, such as a copper wiring. The solder ball 14 is provided on the re-distribution layer 13.

As illustrated in FIG. 8(a), the carrier 20 is removed from the temporary fixing laminated body 45 including the carrier 20 and the sealing structure body 40. As with the method exemplified in FIG. 4, a method for removing the carrier 20 can be a method including irradiating the temporary fixing laminated body 45 with the light from the carrier 20 side. By providing the protective layer 12, a damage to the sealing structure body due to the interfacial peeling or the like between the semiconductor chip 10 and the sealing material layer 11 can be suppressed after the carrier 20 is removed.

After the carrier 20 is removed, as illustrated in FIGS. 8(b) to (e), the remaining sealing structure body 40 is divided by a method including adhering the dicing tape 50 to the protective layer 12, forming the plurality of semiconductor devices 1 by cutting the sealing structure body 40 including the plurality of semiconductor chips 10, the sealing portion 15, the re-distribution layer 13, and the solder ball 14 at the predetermined spot S, and picking up the semiconductor device 1 from the dicing tape 50. By dividing the sealing structure body 40, the singulated semiconductor device 1 is obtained.

In the method exemplified above, the curable resin film is used for both of a function of fixing the semiconductor chip and a function as a material configuring a part of the sealing portion sealing the semiconductor chip during various steps such as the formation of the sealing material layer, the thinning of the semiconductor chip, and the formation of the re-distribution layer. Accordingly, in the method according to the present disclosure, the manufacturing step can be considerably simplified, compared to a case where different materials are separately used for each of the functions.

EXAMPLES

Hereinafter, the present invention will be described in more detail by using Examples. However, the present invention is not limited to such examples.

1. Raw Material

The following raw materials were prepared.

Thermoplastic Resin

Acrylic polymer having epoxy group (Glass transition temperature: 12° C., Weight average molecular weight: 800000)

Epoxy Resin

Bisphenol F-type liquid epoxy resin: YDF-8170C (Product name, manufactured by NIPPON STEEL Chemical & Material Co., Ltd.)

Cresol novolac-type epoxy resin: N-500P-10 (Product name, manufactured by DIC Corporation)

Curing Agent

Phenolic resin: PSM-4326 (Product name, manufactured by Gun Ei Chemical Industry Co., Ltd.)

Phenolic resin: MEH-7800M (Product name, manufactured by MEIWA PLASTIC INDUSTRIES LTD.)

Silica Filler

SC2050-HLG (Product name, manufactured by ADMATECHS COMPANY LIMITED)

R972 (Product name, manufactured by NIPPON AERO-
SIL CO., LTD.)

Light Absorbing Agent

Carbon black: FP-Black (Product name, manufactured by
SANYO COLOR WORKS, Ltd., a dispersion contain-
ing 30% by mass of carbon black)

Coupling Agent (3-mercaptopropyl) trimethoxysilane: A-189 (Product
name, manufactured by Momentive Performance
Materials)

3-ureidopropyl triethoxysilane: A-1160 (Product name,
manufactured by Momentive Performance Materials)

ureidopropyl trialkoxysilane: Z-6119 (Product name,
manufactured by Dow Chemical Japan Limited) Cur-
ing accelerator 1-cyanoethyl-2-phenylimidazole: 2PZ-CN (Product
name, manufactured by SHIKOKU CHEMICALS
CORPORATION)

2. Preparation of Curable Resin Film

A resin varnish for forming curable resin films 1 to 7,
containing each raw material at a compound ratio shown in
Table 1 and containing cyclohexanone as a solvent, was
prepared. The total concentration of components other than
the solvent in the resin varnish was 40% by mass, on the
basis of the mass of the varnish.

TABLE 1

| | | Example | | | | | | |
|---|---|---|---|---|---|---|---|---|
| Curable resin film | | 1 | 2 | 3 | 4 | 5 | 6 | 7 |
| Thermo-plastic resin | Acrylic polymer | 15 | 65 | 15 | 20 | 30 | 40 | 75 |
| Epoxy resin | YDF-8170C | 15 | — | 15 | 15 | 15 | 10 | — |
| | N-500P-10 | 5 | 15 | 5 | 5 | 5 | 5 | 10 |
| Curing agent | PSM-4326 | 15 | — | 15 | 15 | 10 | 10 | — |
| | MEH-7800M | — | 10 | — | — | — | — | 10 |
| Silica filler | SC2050-HLG | 50 | — | 50 | 45 | 40 | 35 | — |
| | R972 | — | 10 | — | — | — | — | 5 |
| Light absorbing agent | FP-Black | 3 | 3 | 10 | 9 | 8 | 2 | 3 |

TABLE 1-continued

| | | Example | | | | | | |
|---|---|---|---|---|---|---|---|---|
| Curable resin film | | 1 | 2 | 3 | 4 | 5 | 6 | 7 |
| Coupling agent | A-189 | 0.1 | 0.4 | 0.1 | 0.1 | 0.1 | 0.1 | 0.4 |
| | A-1160 | 0.3 | 1.1 | — | — | — | — | — |
| | A-6119 | — | — | 0.3 | 0.3 | 0.3 | 0.2 | 1.1 |
| Curing accelerator | 2PZ-CN | 0.05 | 0.03 | — | 0.05 | 0.04 | 0.04 | 0.03 |

A support film was coated with each varnish, and the
coated film was dried to form the curable resin films 1 to 7
with a thickness of 20 μm on the support film. A protective
film was placed on the curable resin film, and a film material
including the support film, any one of the curable resin films
1 to 7, and the protective film was obtained.

3. Evaluation of Curable Resin Film

Shear Viscosity

By laminating a plurality of curable resin, films, a lami-
nated film with a thickness of 1280 μm was prepared as a test
piece. A dynamic viscoelasticity of the test piece was
measured in a range of 35 to 130° C. by using a shear
viscosity measurement device (ARES-G2, manufactured by
TA Instruments, Inc.) in the following condition.

Load: 100 g

Frequency: 1 Hz

Amount of strain: 5%

A shear viscosity of the curable resin film at 100° C. was
measured from the obtained measurement result.

Storage Modulus

By laminating a plurality of curable resin films, a lami-
nated film with a thickness of approximately 240 μm was
prepared. The laminated film was heated at 130° C. for 20
minutes, and then, at 170° C. for 2 hours to cure the curable
resin film. A dynamic viscoelasticity of the obtained cured
product was measured in a range of −80 to 300° C. by using
a dynamic viscoelasticity measurement device (Rheogel-
E4000, manufactured by Universal Building Materials Mer-
chants Co. Ltd.) in the following condition.

Sample size: 4 mm×30 mm

Tensile mode

Frequency: 10 Hz

Temperature increase rate: 3° C./minute

A storage modulus of the curable resin film after curing at
25° C. or 250° C. was obtained from the obtained measure-
ment result. Measurement results of the shear viscosity and
the storage modulus are shown in Table 2.

TABLE 2

| Measurement | | Examples | | | | | | |
|---|---|---|---|---|---|---|---|---|
| | temperature | 1 | 2 | 3 | 4 | 5 | 6 | 7 |
| Shear viscosity before curing (Pa · s) | 100° C. | 11000 | 72500 | 8300 | 11500 | 21500 | 29600 | 35500 |
| Storage modulus after curing (MPa) | 25° C. | 4500 | 600 | 4900 | 3000 | 3000 | 1900 | 946 |
| | 250° C. | 110 | 2 | 115 | 90 | 25 | 10 | 2 |

Tackiness (90-Degree Peeling Strength)

The curable resin film was adhered to a mirror wafer or a glass substrate in an environment of 25° C. or while heating at 70° C. For adhering, a pressure of 0.2 MPa was applied to the curable resin film. A support tape (Oji Tape) was adhered onto the curable resin film adhered to the mirror wafer or the glass substrate, and then, was left to stand for 2 hours. Next, a 90-degree peeling strength was measured by a peeling test of peeling off the curable resin film with respect to the main surface of the mirror wafer or the glass substrate in a direction of 90 degrees. A peeling rate was 50 mm/second. A measurement result is shown in Table 3. In a case where a temperature for adhering the curable resin film to the mirror wafer or the glass substrate (an adhering temperature) was 25° C., the measurement was performed two times. Measured values of the measurement performed two times are shown in Table 3. In a case where the adhering temperature was 25° C., a variation in the measured values was slightly large, but the measured value was not less than 10 N/m. Regarding Example 4, in a case where the curable resin film was adhered to the glass substrate at 70° C., since an adhesion was excessively strong, it was not possible to peel off the curable resin film and to measure the 90-degree peeling strength in the peeling test.

TABLE 3

| Carrier | | | | Transmittance (355 nm)/% | |
| Mirror wafer | | Glass substrate | | | |
| Adhering temperature | | | | Measured value | Relative value |
| 70° C. | 25° C. | 70° C. | 25° C. | | |
| Example 1 | 105 | 60/85 | 95 | 45/130 | Less than 0.1 | 1.01 |
| Example 2 | 110 | 165/90 | 95 | 150/65 | Less than 0.1 | 4.76 |
| Example 3 | 120 | 50/50 | 125 | 140/240 | Less than 0.1 | — |
| Example 4 | 115 | 60/95 | Unpeelable | 80/95 | Less than 0.1 | — |
| Example 5 | 155 | 115/135 | 190 | 110/205 | Less than 0.1 | — |
| Example 6 | 240 | 185/240 | 285 | 235/275 | Less than 0.1 | — |
| Example 7 | 50 | 35/55 | 90 | 60/80 | Less than 0.1 | — |

Light Transmittance

Figure 9:
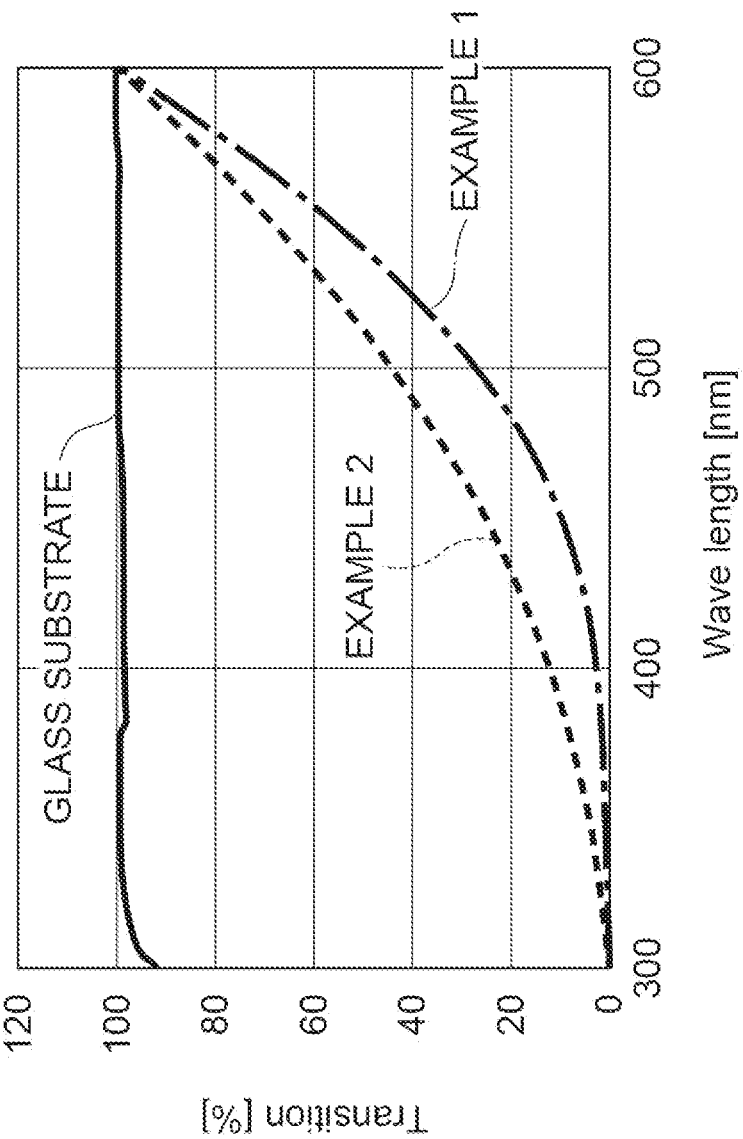
FIG. 9 is an ultraviolet-visible absorption spectrum of the curable resin film.

Ultraviolet-visible absorption of the curable resin films 1 to 7 of Examples 1 to 7 after curing was measured. FIG. 9 is an ultraviolet-visible absorption spectrum of the curable resin films of Examples 1 and 2, which is represented by a relative value based on a transmittance with respect to light at a wavelength of 600 nm. In FIG. 9, an ultraviolet-visible absorption spectrum of the glass substrate is also illustrated. The curable resin film of Example 1 exhibited a transmittance (a relative value) of 1.01% with respect to light at a wavelength of 355 nm. The curable resin film of Example 2 exhibited a transmittance (a relative value) of 4.76% with respect to light at a wavelength of 355 nm.

Peeling Test

The protective film was peeled off from the film material of Example 1 or 2, the exposed curable resin film was placed on a glass substrate (60 mm×60 mm, a thickness of 0.7 mm), and the curable resin film and the glass substrate were adhered by a vacuum laminator. The condition of the vacuum laminator was set to a temperature of 90° C., a pressure of 0.5 MPa, and a pressurization time of 60 seconds. The curable resin film was cured by heating at 130° C. for 20 minutes, and then, heating at 170° C. for 2 hours. A sealing material layer was formed on the protective layer that is the cured curable resin film by using a sealing material containing an epoxy resin in a condition of 150° C. and 300 seconds. The formed sealing material layer was further cured by heating at 150° C. for 6 hours. Accordingly, a laminated body for evaluation having a three-layer structure including the glass substrate, the protective layer, and the sealing material layer was obtained.

The laminated body for evaluation was irradiated with UV laser light at a frequency of 55 kHz and output of 316 mW from the glass substrate side. In the case of the laminated body for evaluation formed by using the film material of Example 1, the glass substrate was naturally peeled off from the protective layer after the irradiation of the laser light without requiring a stress. In the case of the laminated body for evaluation formed by using the film material of Example 2, the glass substrate was peeled off from the protective layer by inserting a razor to the interface.

REFERENCE SIGNS LIST

1: semiconductor device, 3A: support film, 3B: protective film, 10: semiconductor chip, 10a: chip main body, 10b: connection terminal, 11: sealing material layer, 12: protective layer (cured curable resin film), 13: redistribution layer, 14: solder ball, 15: sealing portion, 20: carrier, 22: curable resin film, 30: carrier, 32: adhesive layer, 35: temporary fixing material, 40: sealing structure body, 45: temporary fixing laminated body, 50: dicing tape, L: light, S1: first surface, S2: second surface.

The invention claimed is:

1. A curable resin film comprising:
a light absorbing agent; and
a thermoplastic resin,
wherein the light absorbing agent comprises at least one selected from the group consisting of carbon black, aluminum, nickel, and titanium oxide,
a glass transition temperature of the thermoplastic resin is −40 to 40° C.,
the curable resin film exhibits a transmittance of 20% or less with respect to light at a wavelength of 355 nm when cured, and
when the curable resin film is adhered to a glass substrate with a temperature condition of 25° C., a 90-degree peeling strength between the curable resin film and the glass substrate is 10 N/m or more at 25° C.

2. The curable resin film according to claim 1, comprising a silica filler.

3. The curable resin film according to claim 1, comprising substantially no silicone compound having a polysiloxane chain.

4. The curable resin film according to claim 1, wherein a shear viscosity of the curable resin film is 5000 to 100000 Pa·s at 100° C.

5. The curable resin film according to claim 1, wherein a storage modulus of the curable resin film after curing is 300 to 6000 MPa at 25° C. and 0.1 to 200 MPa at 250° C.

6. A film material for semiconductor device production, comprising:
a support film; and
the curable resin film according to claim 1, provided on the support film.

7. A method for producing a semiconductor device, comprising:

forming a temporary fixing laminated body comprising a carrier, and a sealing structure body provided on a main surface of the carrier, the sealing structure body comprising a plurality of semiconductor chips and a sealing portion sealing the plurality of semiconductor chips; and removing the carrier from the temporary fixing laminated body, wherein the semiconductor chip comprises a chip main body having a first surface and a second surface on a side opposite to the first surface, and a connection terminal provided on the first surface, the sealing portion comprises a protective layer covering the second surface of the plurality of semiconductor chips, and a sealing material layer sealing the plurality of semiconductor chips together with the protective layer, the protective layer is a curable resin film that is cured, the temporary fixing laminated body is formed by a method including providing a laminated body of the curable resin film and the carrier, and adhering the curable resin film and the carrier in the laminated body, the carrier is removed from the temporary fixing laminated body by separating the protective layer from the carrier, the curable resin film exhibits a transmittance of 20% or less with respect to light at a wavelength of 355 nm when cured, and the carrier is a glass substrate or a transparent resin substrate.

8. The method according to claim 7, wherein the protective layer is a permanent film provided in the semiconductor device.

9. The method according to claim 7, further comprising forming a plurality of semiconductor devices by cutting the sealing structure body comprising the plurality of semiconductor chips and the sealing portion comprising the protective layer.

10. The method according to claim 7, further comprising engraving a surface of the protective layer by irradiation of laser light.

11. The method according to claim 7, wherein the temporary fixing laminated body is formed by:

disposing the plurality of semiconductor chips on a surface of the curable resin film stuck to the carrier on a side opposite to the carrier, in a direction in which the second surface is in contact with the curable resin film;

curing the curable resin film, thereby fixing the plurality of semiconductor chips onto the protective layer that is the curable resin film that is cured; and forming the sealing portion comprising the protective layer and the sealing material layer by forming the sealing material layer on the protective layer, in this order.

12. The method according to claim 7, wherein the protective layer is separated from the carrier by irradiating the protective layer with laser light, and wherein the curable resin film comprises a light absorbing agent that absorbs the laser light to produce heat.

13. The method according to claim 7, wherein the curable resin film comprises a thermoplastic resin.

14. The method according to claim 13, wherein a glass transition temperature of the thermoplastic resin is −40 to 40° C.

15. The method according to claim 7, wherein a shear viscosity of the curable resin film is 5000 to 100000 Pa·s at 100° C.

16. The method according to claim 7, wherein a storage modulus of the curable resin film after curing is 300 to 6000 MPa at 25° C. and 0.1 to 200 MPa at 250° C.

17. The method according to claim 12, wherein the light absorbing agent comprises at least one selected from the group consisting of carbon black, aluminum, nickel, and titanium oxide.

18. A method for producing a semiconductor device, comprising:

forming a temporary fixing laminated body comprising a carrier, and a sealing structure body provided on a main surface of the carrier, the sealing structure body comprising a plurality of semiconductor chips and a sealing portion sealing the plurality of semiconductor chips; and removing the carrier from the temporary fixing laminated body, wherein the semiconductor chip comprises a chip main body having a first surface and a second surface on a side opposite to the first surface, and a connection terminal provided on the first surface, the sealing portion comprises an integrated protective layer covering the second surface of the plurality of semiconductor chips, and a sealing material layer sealing the plurality of semiconductor chips together with the protective layer, the protective layer is a curable resin film that is cured, the carrier is removed from the temporary fixing laminated body by separating the protective layer from the carrier, the curable resin film exhibits a transmittance of 20% or less with respect to light at a wavelength of 355 nm when cured, and wherein the temporary fixing laminated body is formed by:

forming a precursor temporary fixing laminated body comprising a temporary fixing material, the plurality of semiconductor chips temporarily fixed onto the temporary fixing material, in a direction in which the first surface is directed toward the temporary fixing material side, and the sealing material layer sealing the plurality of semiconductor chips on the temporary fixing material, the second surface of the plurality of semiconductor chips being exposed from the sealing material layer;

providing the curable resin film covering the second surface and the sealing material layer;

adhering the carrier to the curable resin film;

forming the protective layer by curing the curable resin film; and removing the temporary fixing material from the precursor temporary fixing laminated body, in this order, to obtain the temporary fixing laminated body.

*    *    *    *    *